(12) United States Patent
Aparin et al.

(10) Patent No.: US 6,407,640 B1
(45) Date of Patent: Jun. 18, 2002

(54) TWO-STAGE LNA WITH GOOD LINEARITY

(75) Inventors: Vladimir Aparin; Peter Jivan Shah, both of San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 54 days.

(21) Appl. No.: 09/667,901

(22) Filed: Sep. 22, 2000

(51) Int. Cl.⁷ .............................. H03F 3/191; H03F 1/22
(52) U.S. Cl. ...................................... 330/302; 330/311
(58) Field of Search ........................ 330/283, 302, 330/310, 311

(56) References Cited

U.S. PATENT DOCUMENTS 5,039,954 A  *  8/1991  Bult et al. ............... 330/311 X
5,926,069 A  *  7/1999  Ko et al. .................... 330/302
6,023,197 A  *  2/2000  Ter Laak et al. ....... 330/302 X

* cited by examiner

*Primary Examiner*—Steven J. Mottola
(74) *Attorney, Agent, or Firm*—Philip R. Wadsworth; Charles D. Brown; Howard H. Seo

(57) ABSTRACT

A two-stage stacked high IIP3 LNA with low current consumption is presented. Low-impedance bias terminations and optimum inter-stage match are used for IIP3 enhancement. A new graphical design technique is introduced for optimizing the linearity trade-offs in two-stage amplifiers and for optimizing the on-chip inter-stage matching network. Also, novel active circuits for bias modulation suppression are discussed. The LNA has been fabricated in a commercial SiGe BiCMOS technology, and measurement results are presented.

7 Claims, 7 Drawing Sheets

Overview schematic of the LNA

Figure 1. Overview schematic of the LNA

Figure 2. Performance plots for 1st LNA stage.
The +13dBm IIP3 contour is shown in white on the plots Figure 3. Inter-stage impedance condition

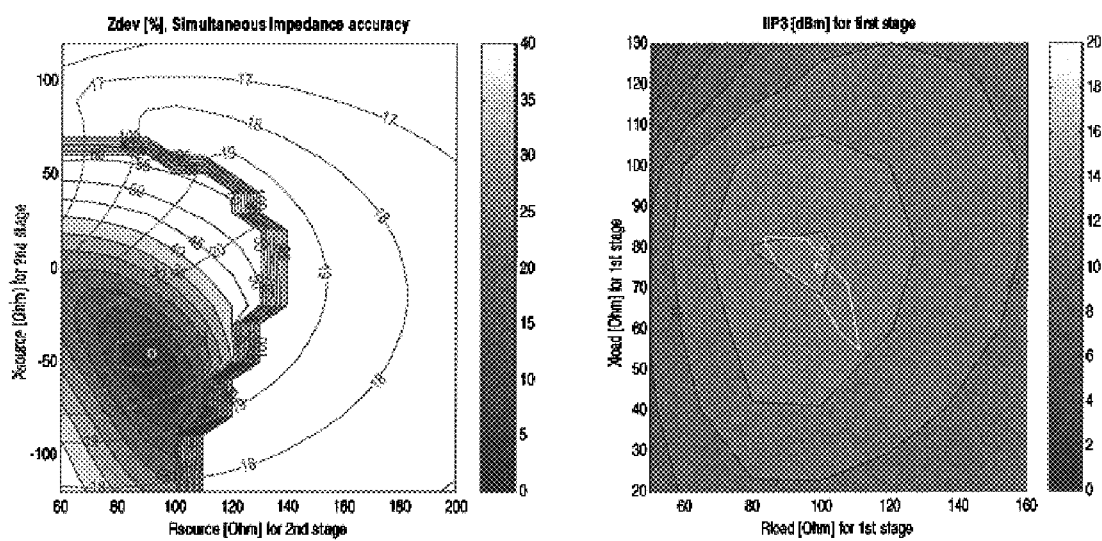
Figure 5. Graph used for designing the inter-stage network

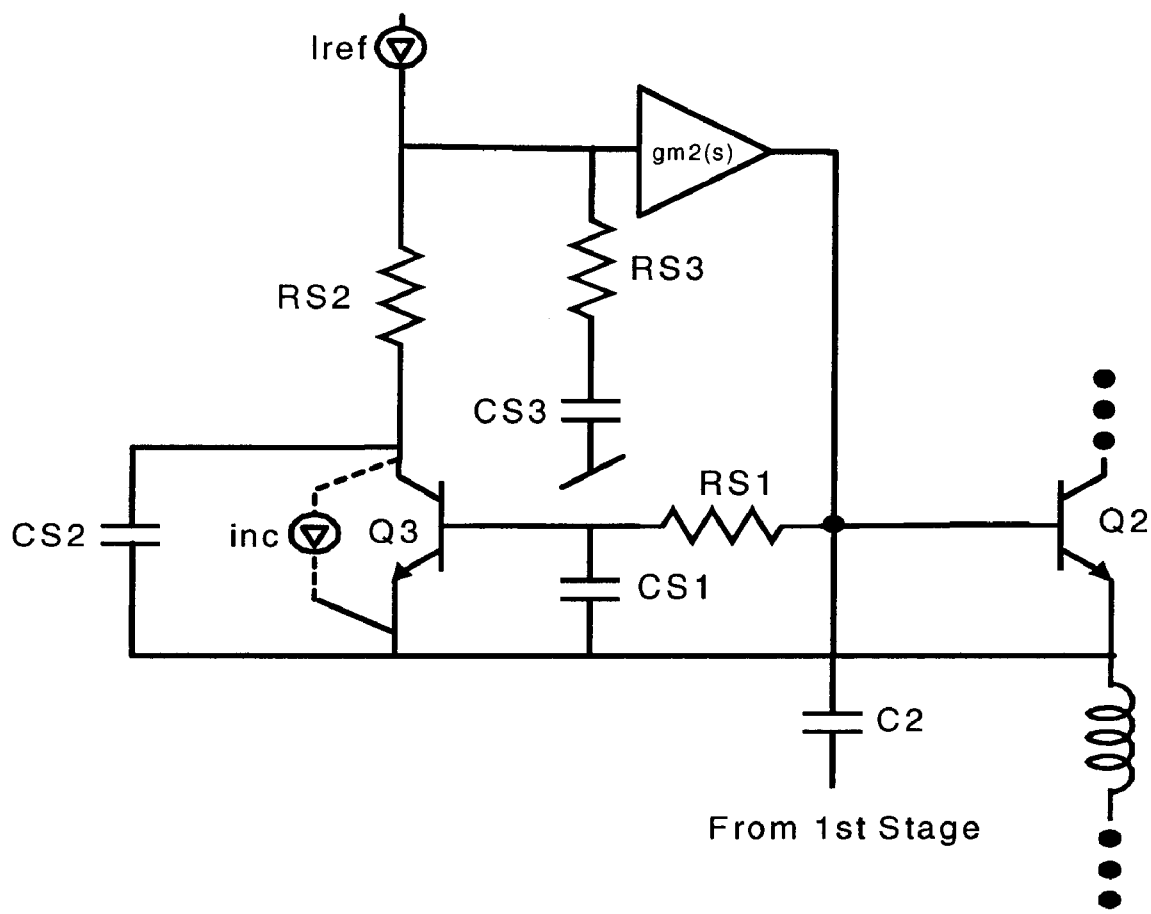
Figure 6. Simplified diagram of sense circuit

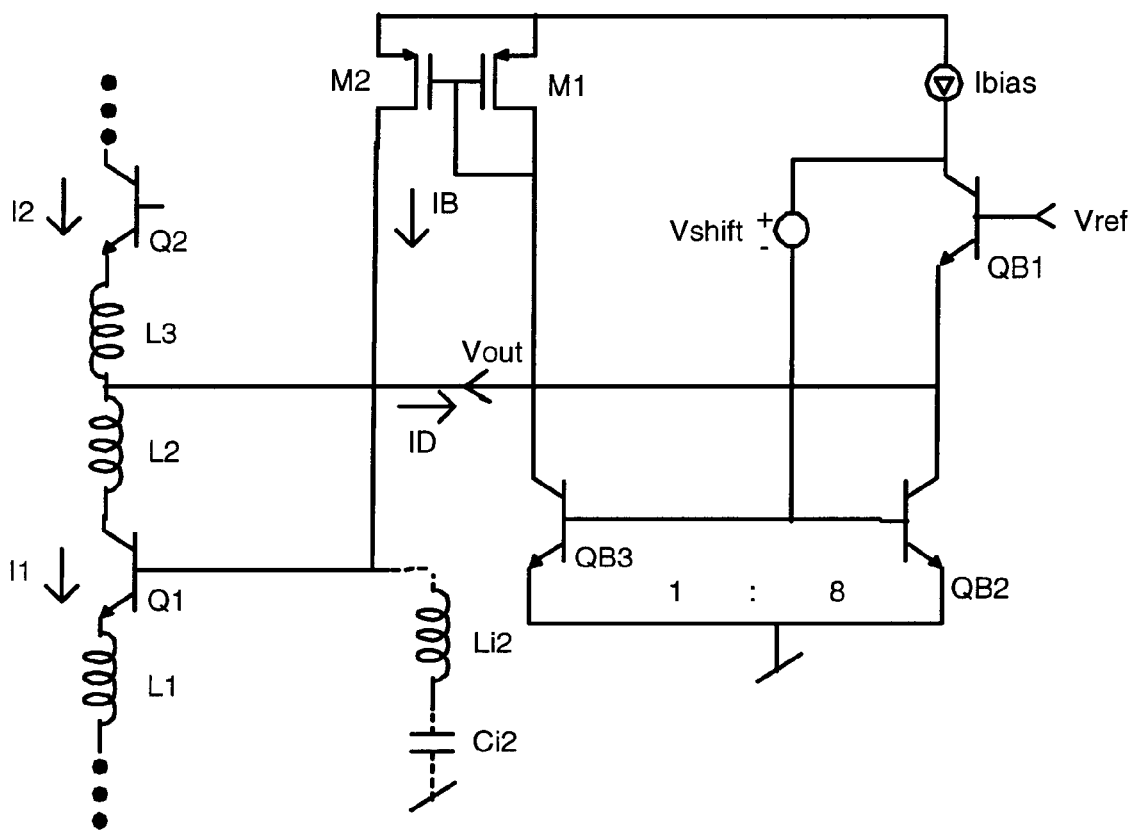
Figure 7. Simplified diagram of the buffer circuit

US 6,407,640 B1

TWO-STAGE LNA WITH GOOD LINEARITY

BACKGROUND OF THE INVENTION

1. Field of the Invention

This invention relates to Low Noise Amplifiers (LNAs) and has particular relation to LNAs which are highly linear.

2. Background Art

In wireless applications it is important to constrain power consumption. At the same time, the operating environment often dictates very high performance for the RF front-end. This is particularly accentuated in the case of CDMA systems, because they operate full-duplex (i.e. receiving and transmitting at the same time). It can be shown that, simultaneously with a low noise figure, the LNA must also have very high IIP3. See, for example, V. Aparin, B. Butler, Paul Draxler, "Cross Modulation Distortion in CDMA Receivers", IEEE International Microwave Symposium, Boston, June 2000. In a bipolar transistor design, the IIP3 typically increases with increasing current consumption but so does the noise figure at high currents. Thus, in a standard design, high IIP3 often results in poor noise figure and excessive current consumption.

Conventional Techniques for IIP3 Improvement in Bias Circuits

There are several conventional techniques to obtain higher IIP3 without sacrificing noise figure or current consumption.

The IIP3 at RF frequencies is strongly affected by the presence of low-frequency distortion products. See, for example, V. Aparin, C. Persico, "Effect of Out-of-Band Termination on Intermodulation Distortion in Common-Emitter Circuits", IEEE MTT-S Dig, vol. 3, June 1999, pp. 977–980. In a two-tone test, nonlinearities will cause the generation of several mixing products. One of these occurs at (f1−f2) where f1 and f2 are the frequencies of the two tones. This can be viewed as a low-frequency modulation of the operating point. Due to unavoidable internal feedback inside the transistor as well as external feedback, the (f1−f2) product will mix again with f1 and f2, thus creating in-band distortion products at the IM3 frequencies (f1−f2)=f1=2*f1−f2 and (f2−f1)+f2=2*f2−f1. In order to obtain high IIP3, it is therefore beneficial to ensure that a low impedance is presented to these products, essentially shorting them out.

It is a common design approach of power amplifiers to reduce the low-frequency impedance of the bias circuits as much as possible to avoid the bias modulation. See, for example, F. N. Sechi, "Linearized Class-B Transistor Amplifiers", IEEE J. Solid-State Circuits, vol. 11, April 1976, pp. 264–270.

SUMMARY OF THE INVENTION

The low-frequency impedance approach has not been previously used in the design of LNAs (as distinct from bias circuits). As it will be seen later the improvement can be quite dramatic.

In addition to this technique, we also take advantage of the fact that the chosen two-stage architecture allows tailoring of the inter-stage matching network to provide optimum IIP3. This is utilized in a technique explained below in "Graphical Design Technique".

BRIEF DESCRIPTION OF THE DRAWINGS

FIG. 5 shows graphs useful for designing the inter-stage network.

FIG. 6 shows a simplified diagram of a sense circuit.

FIG. 7 shows a simplified diagram of a buffer circuit.

DETAILED DESCRIPTION OF THE DRAWINGS

LNA Topology

Figure 1:
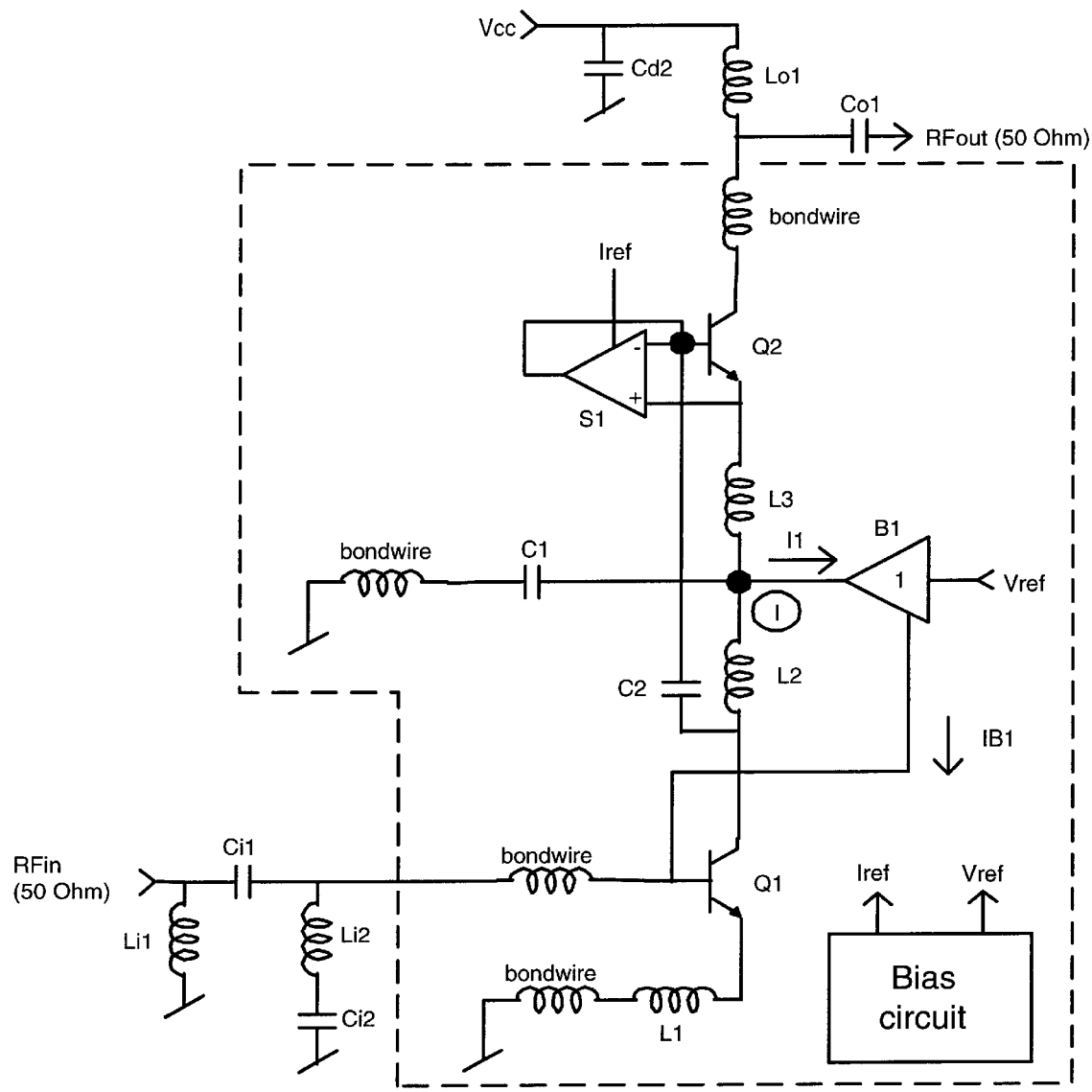
FIG. 1 shows a simplified overview schematic of an LNA.

A simplified schematic of the LNA is shown in FIG. 1. The LNA employs a two-stage architecture that enables high gain while providing good reverse isolation, thereby guaranteeing unconditional stability. In order to save power consumption, the two stages are stacked, sharing the same supply current. The first stage consists of a first transistor Q1 and on-chip degeneration inductor L1. The input matching network consists of CI1 and LI1. Inductor LI2 acts as an RF choke, and CI2 is a large-value bypass capacitor. They provide a low-impedance low-frequency path from the base. The low-impedance path for the emitter is provided by L1. Voltage follower B1 absorbs the low-frequency distortion product current I1 from the collector through node I. This additionally prevents IIP3 degradation due to low-frequency products entering Q2's emitter. The B1 circuit also provides the biasing current IB1 for Q1, as described below in "Buffer Circuit B1".

The second stage consists of a second transistor Q2 and on-chip degeneration inductor L3. Its supply voltage is supplied through the external matching network (Lo1, Co1) as shown. Node I acts as a virtual ground, which provides the supply for the first stage as well as the AC ground for the second. For in-band frequencies the virtual ground property is ensured by C1 resonating with its bondwire. At low frequencies and DC, voltage follower B1 provides the virtual ground. It would appear that it also provides the necessary low-frequency path for Q2's emitter. Unfortunately, the series resistance in on-chip inductor L3 is high enough to cause noticeable IIP3 degradation. Instead a sense circuit S1 is used. This circuit senses the low-frequency part of the base-emitter voltage and regulates it to AC zero by controlling the base current. Thus at low frequencies a virtual short-circuit is created. Circuit S1 also biases Q2, ensuring a bias current proportional to a reference current Iref.

The two stages are connected by L2 and C2, which implement a shunt-L, series-C inter-stage network. This is crucial in optimizing IIP3, as explained below.

Graphical Design Technique

Selecting correct transistor sizes and component values to obtain the desired performance presents a challenge. To aid in this process a graphical design method was developed. First, the two stages were designed separately, and then inter-stage network component values were determined.

Figure 2:
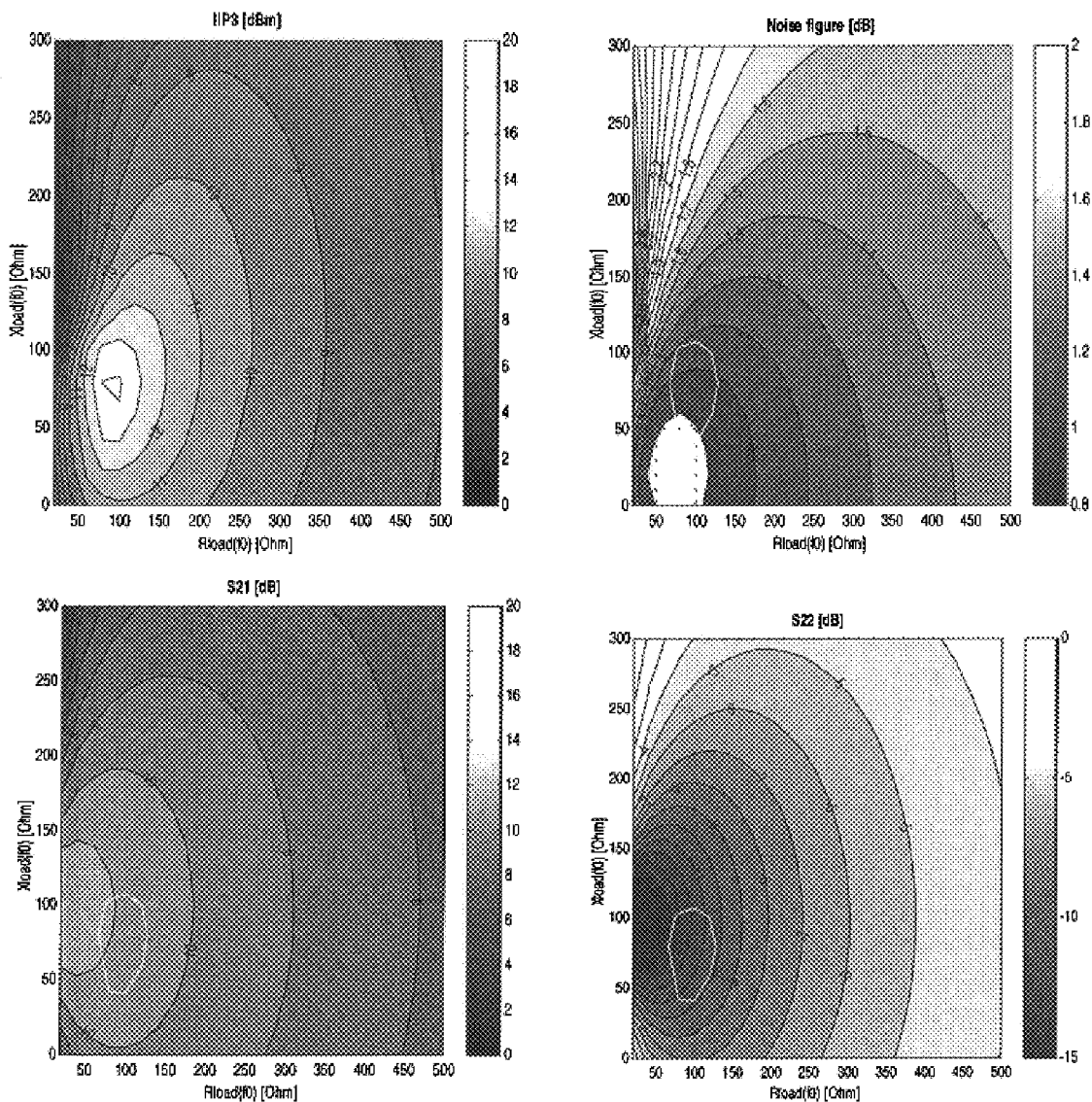
FIG. 2 is a performance plot for the first LNA stage.

First a set of collector currents and a set of transistor sizes were chosen as candidates for the first stage. For every combination of transistor size and current, the load impedance is swept while, for each impedance value, a complex conjugate match (power match) is performed at the input. This process was automated, using a simulation script. The simulated gain, noise figure, and IIP3 at each load impedance were recorded, and the results were subsequently plotted in contour plots. FIG. 2 shows the plots for the chosen first stage.

For the second stage the same methodology was used, except that here the output was always kept power-matched while the source impedance was swept.

The obtained performance for the two stages is summarized below in Table 1. Also shown is a rough estimate of composite performance, based on the well-known formulas for cascaded noise figure and IIP3. Note that this does not take into account additional circuit losses and distortion sources, such as in the inter-stage network, matching components, and the S1 and B1 circuits.

TABLE 1

| Parameter | 1st stage | 2nd stage | Estimated composite |
|---|---|---|---|
| Collector current | 5 mA | 5 mA | 5 mA |
| Collector DC voltage | 1.1 V | 2.7 V | 2.7 V |
| Optimal load imp. | ~ 100 + j80Ω | | pwr match |
| Optimal source imp. | | ~ 90 − j45Ω | pwr match |
| IIP3 | ~ +13 dBm | ~ +21 dBm | ~ +9 dBm |
| S21 | ~ 10 dB | ~ 7 dB | ~ 17 dB |
| Noise Figure | ~ 1.1 dB | ~ 1.5 dB | ~ 1.3 dB |
| Input match S11 | pwr match | ~ −9 dB | pwr match |
| Output match S22 | ~ −11 dB | pwr match | pwr match |

Evidently optimum IIP3 does not coincide with a power match for each stage individually. However, the composite two-stage LNA has the desirable property of allowing power-matching at both input and output, as long as the inter-stage network provides the optimum load and source impedances listed in the table. Since the inter-stage network is entirely on-chip, this is well controlled and independent of PCB parasitics and the like.

Figure 3:
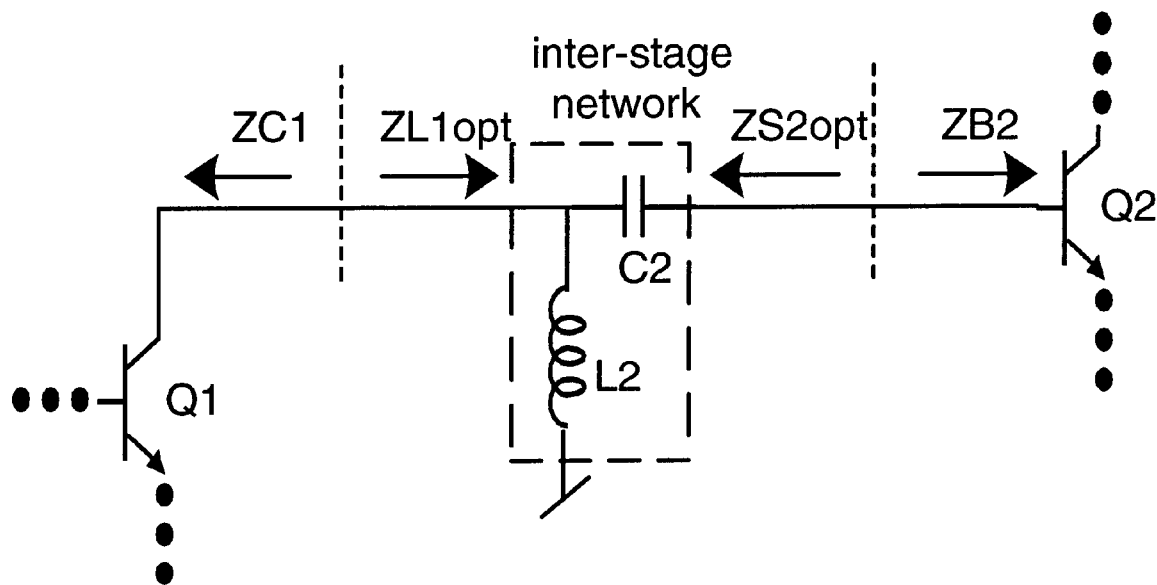
FIG. 3 shows the conditions driving the design of the inter-stage network.

FIG. 3 shows the conditions driving the design of the inter-stage network. It must transform the first stage output impedance ZC1 into the desired second stage source impedance ZS2opt while simultaneously transforming the second stage input impedance ZB2 into the desired first stage load impedance ZL1opt. It can be shown that, in general, it is impossible to satisfy this simultaneous impedance condition with a loss-less network. See, for example, Robert E. Collin, "Foundations for microwave engineering", McGraw-Hill, New York, 1992.

Figure 4:
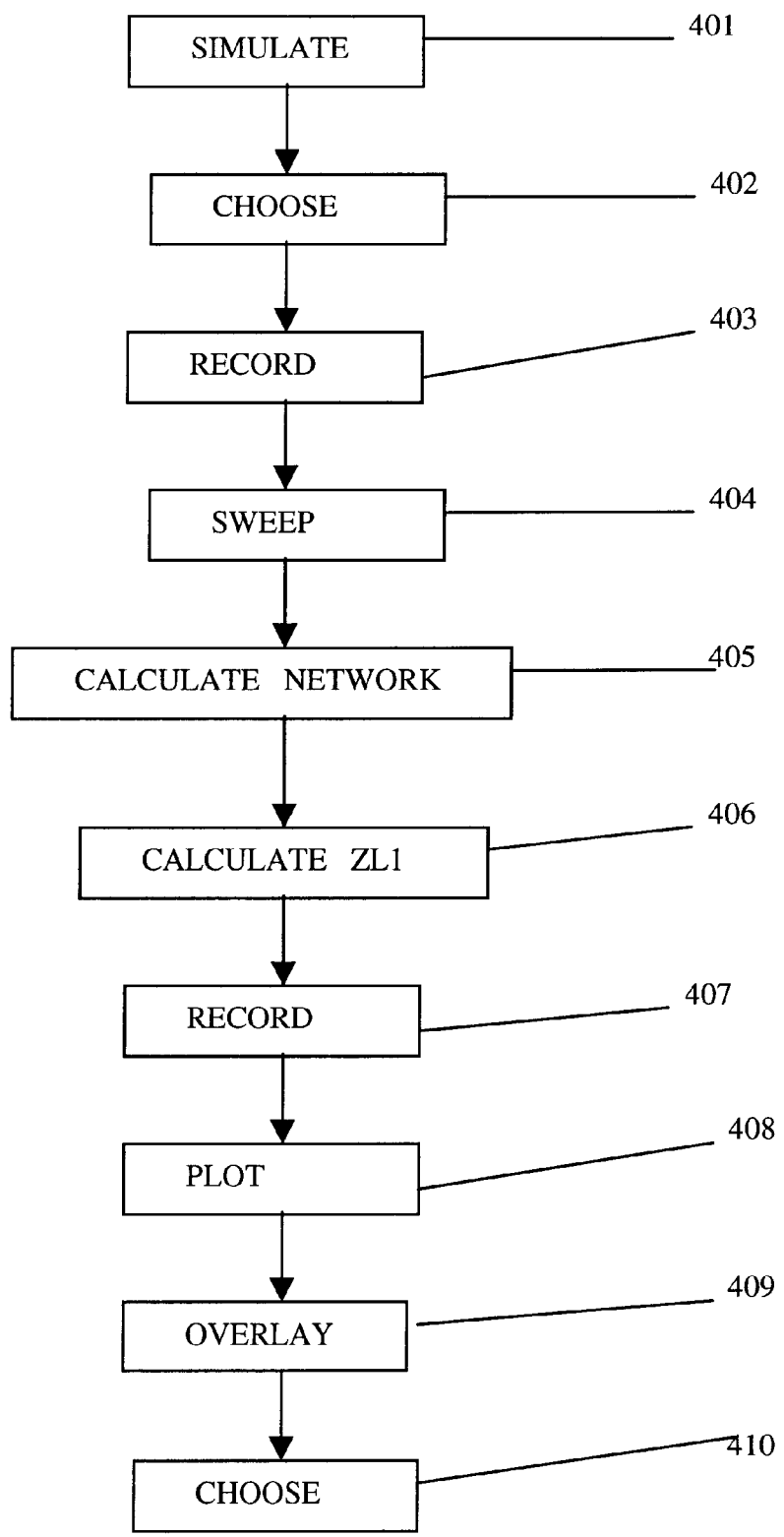
FIG. 4 shows a flow-chart for designing the inter-stage network.

However, in some cases we can obtain an adequate compromise. To assist in this, Applicants wrote a MATLAB script that enables interactive exploration of the design space, based on the data from the previously simulated contour plots. The procedure is as follows (see FIG. 4):

1) The designer chooses (402) a desirable first stage load impedance, ZL1opt, in the IIP3 contour plot. This is shown as an 'x' in the right hand plot in FIG. 4. The corresponding first stage output impedance, ZC1, is recorded (403).
2) The script sweeps (404) through all the source impedances ZS2 that were simulated (401) for the second stage and, for each one, calculates (405) an inter-stage network that transforms ZC1 into ZS2.
3) For each ZS2, the calculated inter-stage network also transforms the corresponding second stage input impedance, ZB2, into a load impedance to the first stage, ZL1. The script now calculates (406) ZL1 and records (407) the relative deviation from the simultaneous matching condition, given as Zdev=|(ZL1−ZL1opt)/ZL1opt|.
4) The script plots (408) a contour plot of Zdev versus second stage source impedance, and on top of this it overlays (409) the IIP3 contour plot for the second stage. This is shown in the left plot of FIG. 4. The Zdev plot only covers part of the plot. Outside this region it was not possible to calculate an inter-stage network with the given topology.
5) Based on this plot, the designer now chooses (410) a suitable compromise between good second stage IIP3 and fulfilling the optimum load requirements of the first stage. The chosen point is shown as an 'o' in the left hand plot, and the corresponding first stage load impedance is shown as an 'o' in the right hand plot. The white contour shows how the highest second stage IIP3 contour maps into first stage load impedance.

FIG. 5 shows graphs useful in designing the inter-stage network. An inspection of FIG. 5 shows that, in the present design, the simultaneous matching condition coincides with the highest possible second stage IIP3. In other words: The inter-stage network ensures optimum IIP3 for both stages.

Sense Circuit S1

A simplified diagram of the sense circuit is shown in FIG. 6. RS1 and CS1 attenuate the RF part of the base-emitter voltage of LNA transistor Q2, leaving the low-frequency distortion products unattenuated. Q3 amplifies these, and its output current is integrated onto CS3. The transadmittance amplifier gM2(s) then generates a feedback current to the base of Q2, which counteracts the low-frequency distortion products generated there. Resistor RS3 introduces a zero that compensates the pole introduced by RS1 and CS1. Transistor Q3 additionally forms a current mirror with Q2, and the LNA bias current thus becomes proportional to Iref.

Due to the much larger current in Q2, its emitter impedance is much lower than that of Q3. Consequently, if no special measures are taken, the collector shot noise of Q3 (inc in FIG. 5) will continue into the emitter of Q2 and subsequently to the LNA output, where it causes significant degradation of noise figure. For this reason, RS2 and CS2 have been introduced. At RF frequencies RS2 poses a high-impedance path for inc, whereas CS2 is low-impedance. Consequently the high-frequency part of the noise current now simply circulates in Q3 and CS2, and does not reach Q2's emitter. The same mechanism also prevents residual RF products from reaching the transadmittance amplifier gM2(s), where they could otherwise cause intermodulation distortion. That greatly reduces the linearity requirements of gM2(s).

The gM2(s) transadmittance amplifier completes the loop and contains a compensation capacitor with a resistor in series to provide an integration and a zero. The overall loop gain now contains two integrations (one from CS3 and one from the compensation capacitor) and one zero, i.e. it is of the form $L(s)=(1+\tau_z s)/\tau_{p1}\tau_{p2}s^2$. The double integration provides very high loop gain at low frequencies and low gain at RF frequencies. Also it can be shown that it reduces the problem of the LNA transistor's emitter presenting an admittance with a negative real part. The zero is necessary to ensure stability.

The presence of RS1 affects the overall LNA noise figure and from a strict small-signal point of view it is beneficial to make it large. However, the sense circuit effectively places the low-frequency voltage noise of RS1 across the base-emitter stretch of Q2, causing large low-frequency noise current in Q2. If a strong jammer is present, this noise will mix up around the jammer, resulting in degradation of noise figure. In the present design the chosen value of RS1 causes 0.2 dB degradation of small-signal noise figure and an additional 0.1 dB, when a −30 dBm jammer is present at the input.

Buffer Circuit B1

FIG. 7 shows a conceptual diagram of the buffer. Transistor QB1 functions as an emitter follower with QB2 closing a high-gain feedback loop around it. Essentially the current in QB1 is forced to be equal to Ibias, and the signal current flows in QB2. As a consequence the base-emitter voltage of QB1 is nearly constant, causing Vout=Vref, i.e. effecting a much lower output impedance than that of a standard emitter follower. Note that this improvement is achieved without any additional current consumption.

The biasing of the first LNA transistor Q1 is achieved by observing that any difference between the bias current of Q2 and Q1 will flow into QB2. Due to the QB2/QB3 and M1/M2 mirrors, this difference current is fed to the base of Q1. Thus, effectively, Q1 is diode coupled at low frequencies. Due to the external CI2 capacitor (cf. FIG. 1) the loop gain is very small at high frequencies, and M2 presents a high impedance. Thus RF performance is not affected.

The Ibias driving QB1 only determines the current flowing in QB1. The Iref current sets the bias current in Q2 as shown in FIG. 5 in the paper. Referring to FIG. 7, the bias current in Q1 is determined as $$I1=B1*(ID+Ibias)/8,$$

where B1 is the current gain (beta) of Q1. The difference between I1 and I2 is ID so we also have $$I1=B1(I2-I1+Ibias)/8$$

or $$I1=B1/(1+B1)*I2+B1(1+B1)*Ibias/8$$

To ensure I1=I2 we need $$Ibias=8*I2/B1$$

However, since B1 is quite large (on the order of 100), even a quite large deviation from this value will only result in a small current error between I1 and I2. Thus, the value of Ibias is not critical in setting the bias currents in Q1 or Q2; its main purpose is to set the current in the buffer transistors QB2 and QB1.

The emitters of transistors QB2 and QB3 are grounded. FIG. 7 annotates this grounding with an indication that QB2 is 8 times larger than QB3. Since the base-emitter voltages are the same, the current in QB3 will be ⅛ times that in QB2.

The collector of transistor QB1 is connected to this ground through a voltage shifter Vshift. There are several ways of implementing this. One particularly simple way is simply to use a diode.

In the buffer circuit (indeed, throughout the entire invention), some transistors are shown as being bipolar, and some are shown as being field-effect. This is not required, and the two types of transistors can be interchanged with appropriate modifications to the rest of the circuit. The final choice is a trade-off, since bipolar transistors will most likely give the best performance, but of course, a CMOS process is cheaper. Applicants prefer using PMOS devices since PNP transistors are not available in the fabrication process used by Applicants. The terms "source", "gate", and "drain" may therefore be used interchangeably with "emitter", "base", and "collector", and the claims should be read in this light.

Measured Results

The LNA is a part of a larger RF chip. It was fabricated in IBM SiGe5HP technology, packaged in a BCC32++ package, and mounted on a PCB board using standard SMD components for matching. The measured performance compared with simulation is shown below in Table 2. Note that, unlike the above discussion of the Graphical Design Technique, the simulated performance shown here includes the full circuitry and employs extensive modeling of parasitics and external components. The measurements were taken at 1.96 GHz. For IIP3, Applicants applied two −30 dBm input tones at the input, at 1960 MHz and 1961 MHz.

TABLE 2

| Parameter | Simulated | Measured |
| --- | --- | --- |
| Total current Consumption | 6.6 mA | 6.5 mA |
| LNA transistor current | 5 mA | 5 mA |
| IIP3 (−30 dBm tones) | +9 dBm | +7.6 dBm |
| Noise Figure | 1.85 dB | 1.9 dB |
| Forward gain S21 | 15 dB | 15.3 dB |
| Reverse isolation S12 | −26.0 dB | −27.6 dB |
| Input match S11 | <−20 dB | −15.6 dB |
| Output match S22 | <−20 dB | −19.0 dB |

Finally, to illustrate the beneficial effects of low-impedance bias terminations, the IIP3 was measured with LI2 removed. The IIP3 dropped to +1.7 dBm, while all other parameters remained the same.

Conclusion

A graphical design technique for two-stage LNAs has been developed to achieve high gain, high IIP3, and low noise figure simultaneously. The technique relies on simulating contour plots that visualize performance versus load or source impedances. It allows the two stages to be designed independently, and then to be combined by a graphical trade-off method, which designs the inter-stage network to ensure optimum composite IIP3.

The LNA also relies on low-impedance bias terminations, and it was shown how this can be implemented by a combination of active and passive circuits with minimal impact on RF performance.

To validate the method and circuits, the LNA was fabricated in SiGe BiCMOS technology. Measurement results show close agreement with simulation.

While several embodiments of the present invention are discussed above, the true spirit and scope of the invention are not limited thereto, but are limited only by the appended claims.

We claim as our invention:

1. A method for designing a low noise amplifier (LNA), wherein:
   (a) the LNA comprises a first stage and a second stage; and
   (b) the method comprises the steps of
      (1) simulating a plurality of source impedances ZS2 for the second stage;
      (2) choosing a desirable first stage load impedance, ZL1opt, in an IIP3 contour plot;
      (3) recording a corresponding first stage output impedance, ZC1;
      (4) sweeping through all the source impedances ZS2 that were simulated for the second stage;
      (5) for each source impedance, calculating an inter-stage network that:
         (A) transforms ZC1 into ZS2; and
         (B) transforms the corresponding second stage input impedance, ZB2, into a load impedance to the first stage, ZL1;

(6) calculating ZL1;
(7) recording the relative deviation from the simultaneous matching condition, given as Zdev=|(ZL1−ZL1opt)ZL1opt|;
(8) plotting a contour plot of Zdev versus second stage source impedance;
(9) on top of this contour plot, overlaying an IIP3 contour plot for the second stage; and
(10) based on this plot overlay, choosing a suitable compromise between good second stage IIP3 and fulfilling the optimum load requirements of the first stage.

2. A low noise amplifier, comprising:
(a) a first stage comprising:
(1) a first transistor Q1-comprising:
(A) an emitter;
(B) a base connected to receive an input signal; and
(C) a collector connected to produce an output signal; and
(2) a degeneration inductor L1 through which the first transistor's emitter is grounded;
(b) a second stage comprising:
(1) a second transistor Q2 comprising:
(A) an emitter;
(B) a base connected to receive an input signal; and
(C) a collector connected to produce an output signal;
(2) a degeneration inductor L3 through which the second transistor's emitter is grounded to a virtual ground I; and
(3) a sense circuit S1 which is:
(A) connected across the base and the emitter of the second transistor;
(B) constructed to sense the low-frequency part of the base-emitter voltage and to regulate it to AC zero by controlling the base current;
(C) connected to a source of a reference current Iref; and
(D) constructed to bias the base of the second transistor with a bias current which is proportional to the reference current; and
(c) an inter-stage impedance transforming network constructed to produce a compromise between good second stage IIP3 and optimum first stage load requirements; and
(d) a buffer circuit B1 which is:
(1) connected to a source of a reference voltage Vref; and
(2) constructed to:
(A) absorb a low-frequency distortion product current I1 from the virtual ground I; and
(B) provide a biasing current IB1 to the base of the first transistor Q1.

3. The low noise amplifier of claim 2, wherein the inter-stage impedance transforming network comprises:
(a) a capacitor C2 connected between the collector of the first transistor Q1 and the base of the second transistor Q2; and
(b) an inductor L2 connected between the collector of the first transistor Q1 and the virtual ground I.

4. The low noise amplifier of claim 3, wherein the values of the capacitor C2 and the inductor L2 are determined by the steps of:
(a) simulating a plurality of source impedances ZS2 for the second stage;
(b) choosing a desirable first stage load impedance, ZL1opt, in an IIP3 contour plot;
(c) recording a corresponding first stage output impedance, ZC1
(d) sweeping through all the source impedances ZS2 that were simulated for the second stage;
(e) for each source impedance, calculating an inter-stage network that:
(1) transforms ZC1 into ZS2; and
(2) transforms the corresponding second stage input impedance, ZB2, into a load impedance to the first stage, ZL1;
(f) calculating ZL1;
(g) recording the relative deviation from the simultaneous matching condition, given as Zdev=|(ZL1−ZL1opt)/ZL1opt|;
(h) plotting a contour plot of Zdev versus second stage source impedance;
(i) on top of this contour plot, overlaying an IIP3 contour plot for the second stage; and
(j) based on this plot overlay, choosing a suitable compromise between good second stage IIP3 and fulfilling the optimum load requirements of the first stage.

5. The low noise amplifier of claim 2, wherein the sense circuit S1 comprises:
(a) a third transistor Q3 comprising:
(1) an emitter, connected to the emitter of the second transistor Q2;
(2) a base, connected through a first resistor RS1 to the base of the second transistor Q2; and
(3) a collector, connected through a second resistor RS2 to the source of the reference current Iref;
(b) a first capacitor CS1 connected between the base and emitter of the third transistor;
(c) a second capacitor CS2 connected between the emitter and collector of the third transistor;
(d) a third resistor RS3 connected between the source of the reference current Iref and, through a third capacitor CS3, ground; and
(e) a transadmittance amplifier gM2(s) connected to receive current from the source of the reference current Iref and to apply current to the base of the second transistor Q2.

6. The low noise amplifier of claim 2, wherein the buffer circuit comprises:
(a) a first buffer transistor QB1 comprising:
(1) an emitter connected to the virtual ground I;
(2) a base connected to the reference voltage Vref; and
(3) a collector connected to a first side of a bias current source Ibias;
(b) a second buffer transistor QB2 comprising:
(1) an emitter connected to ground;
(2) a base; and
(3) a collector connected to the virtual ground I;
(c) a voltage shifter connected between the collector of the first buffer transistor QB1 and the base of the second buffer transistor QB2;
(d) a third buffer transistor QB3 comprising:
(1) an emitter connected to ground;
(2) a base connected to the base of the second buffer transistor QB2; and
(3) a collector;
(e) a first mirror transistor M1 comprising:
(1) a source connected to a second side of the bias current source Ibias;
(2) a gate; and (3) a drain connected to the gate and to the collector of the third buffer transistor QB3; and (f) a second mirror transistor M2 comprising:
(1) a source connected to the source of the first mirror transistor M1;
(2) a gate connected to the gate of the first mirror transistor M1; and (3) a drain connected to the base of the first transistor Q1.

7. The low noise amplifier of claim 6, wherein the second buffer transistor QB2 has a size approximately eight times that of the third buffer transistor QB3.

* * * * *